(12) United States Patent
Gorecki et al.

(10) Patent No.: US 6,424,209 B1
(45) Date of Patent: Jul. 23, 2002

(54) INTEGRATED PROGRAMMABLE CONTINUOUS TIME FILTER WITH PROGRAMMABLE CAPACITOR ARRAYS

(75) Inventors: James L. Gorecki, Hillsboro; Yaohua Yang, West Linn, both of OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/507,580

(22) Filed: Feb. 18, 2000

(51) Int. Cl.[7] ................................................. H03K 5/00

(52) U.S. Cl. ........................ 327/554; 327/553; 327/337; 330/9

(58) Field of Search .......................... 327/554, 94, 553, 327/336, 337; 333/172; 330/9

(56) References Cited

U.S. PATENT DOCUMENTS

| | | | |
|---|---|---|---|
| 4,250,556 A | 2/1981 | Goser | 364/600 |
| 4,531,113 A | 7/1985 | Abraham | 340/347 C |
| 4,733,205 A | * 3/1988 | Hughes | 333/172 |
| 4,801,888 A | 1/1989 | Haque | 330/9 |
| 4,857,778 A | 8/1989 | Hague | 307/521 |
| 5,068,823 A | 11/1991 | Robinson | 395/500 |
| 5,107,146 A | 4/1992 | El-Ayat | 307/465 |

(List continued on next page.)

FOREIGN PATENT DOCUMENTS

| | | |
|---|---|---|
| EP | 0322382 B1 | 9/1994 |
| EP | 0871223 A1 | 10/1998 |
| EP | 0611165 B1 | 7/1999 |
| WO | WO 98/21726 | 5/1998 |

OTHER PUBLICATIONS

Maxim Integrated Products, "Digitally–Programmed, Dual $2^{nd}$ Order Continuous Lowpass Filters," Aug. 1997, pp. 1–16.
Massimo A. Sivolotti, "A Dynamically Configurable Architecture For Prototyping analog Circuits," Mar. 1998, pp. 237–258.
Edward K. F. Lee and P. G. Gulak, "Prototype Design of a Field Programmable Analog Array," Aug. 30, 1990, pp. 2.2.1–2.2.8.
Edward K.F. Lee and P. Glenn Gulak, "A CMOS Field–Programmable Analog Array," *Lee Journal Of Solid–State Circuits*, vol. 26, No. 12, Dec. 1991, pp. 1860–1867.
Frank Goodenough, "Analog Counterparts Of FPGAS Ease System Design," *Electronic Design*, Oct. 14, 1994.
IMP, Inc., Preliminary Product Information, IMP50E10 EPAC™ (Electrically Programmable Analog Circuit), Nov. 1994, pp. 1–16.

*Primary Examiner*—Dinh T. Le
(74) *Attorney, Agent, or Firm*—Skjerven Morrill MacPherson LLP; Marc R. Ascolese

(57) ABSTRACT

A programmable capacitor array including a plurality of user-selectable, numerically weighted capacitors, each of which includes at least one fixed capacitor and one manufacturer-controlled trim capacitor, advantageously provides a variety of selectable capacitance values for a programmable analog integrated circuit. When coupled to a memory, for example a static memory, switches can be controlled that determine whether a particular fixed capacitor (user-selectable) or trim capacitor (manufacturer-selectable) is electrically coupled into the circuit. User access to those portions of memory controlling switches associated with the trim capacitors can be restricted via an I/O interface and security command. Such programmable capacitor arrays allow efficient implementation of user-programmable filter circuits where the user can conveniently program or reprogram a variety of filter parameters.

20 Claims, 5 Drawing Sheets

U.S. PATENT DOCUMENTS

| | | | |
|---|---|---|---|
| 5,196,740 A | 3/1993 | Austin | 307/303 |
| 5,245,262 A | 9/1993 | Moody et al. | 318/560 |
| 5,311,142 A | 5/1994 | Terane et al. | 330/10 |
| 5,397,944 A | 3/1995 | DuPuis | 327/307 |
| 5,416,484 A | 5/1995 | Lofstrom | 341/159 |
| 5,463,349 A | 10/1995 | Petersen et al. | 330/254 |
| 5,519,265 A | 5/1996 | Latham, II | 327/513 |
| 5,554,957 A | 9/1996 | Klein | 330/251 |
| 5,557,234 A | 9/1996 | Collins | 327/563 |
| 5,574,678 A | 11/1996 | Gorecki | 364/807 |
| 5,608,345 A | 3/1997 | Macbeth et al. | 327/337 |
| 5,625,316 A | 4/1997 | Chambers et al. | 327/553 |
| 5,625,361 A | 4/1997 | Garrity et al. | 341/172 |
| 5,680,070 A | 10/1997 | Anderson et al. | 327/336 |
| 5,821,776 A | 10/1998 | McGowan | 326/41 |
| 5,877,612 A | 3/1999 | Straw | 330/254 |
| 5,905,398 A | 5/1999 | Todsen et al. | 327/337 |
| 5,912,567 A | 6/1999 | Drost et al. | 327/89 |
| 5,912,583 A | 6/1999 | Pierson et al. | 327/553 |
| 5,914,633 A | 6/1999 | Comino et al. | 327/553 |
| 5,952,952 A | 9/1999 | Choi et al. | 341/172 |
| 5,959,871 A | 9/1999 | Pierzchala et al. | 364/489 |
| 5,966,047 A * | 10/1999 | Anderson et al. | 327/337 |
| 6,013,958 A | 1/2000 | Aytur | 307/109 |
| 6,014,097 A | 1/2000 | Brandt | 341/156 |
| 6,058,294 A * | 5/2000 | Bruwer et al. | 327/337 |
| 6,111,437 A | 8/2000 | Patel | 327/74 |

* cited by examiner

INTEGRATED PROGRAMMABLE CONTINUOUS TIME FILTER WITH PROGRAMMABLE CAPACITOR ARRAYS

BACKGROUND OF THE INVENTION

1. Field of the Invention

This invention relates to analog signal processing, and more particularly to programmable integrated circuits that perform analog processing, and include both user and manufacturer programmable capacitor arrays.

2. Description of the Related Art

Typically, analog integrated circuits are designed to receive one or more analog input signals, and process those signals by performing specific functions such as amplification, attenuation, filtering, integration, addition and subtraction. These functions usually dictate the topology of the analog integrated circuit. For example, the topologic arrangement of operational amplifiers and resistors are adjusted to provide either inverting or non-inverting gain. Every topology has specific noise, distortion and offset voltage sensitivities. Changing an analog circuit's function often requires a change in the topology of the analog circuit, which in turn changes the noise, distortion and offset voltage characteristics of the circuit.

An analog integrated circuit with a programmable analog circuit block architecture permits change in a function of the analog circuit without changing the topology of the circuit elements, thereby reducing changes in voltage offset and distortion created by changes in topologies. Examples of such analog integrated circuit architectures can be found in U.S. Pat. No. 5,574,678, entitled "Continuous Time Programmable Analog Block Architecture," by James L. Gorecki, which is incorporated herein by reference in its entirety.

In addition to such programmable analog circuits, another way to change an analog circuit's function or performance characteristics is to vary the values of components in the circuit. In the case of an analog filter circuit, it is well known that the performance characteristics of the filter (e.g., the cutoff or corner frequency $f_c$, the stop frequency $f_s$, the passband ripple, and the stopband attenuation) depend generally on the RC product of the filter, and more particularly on the values of various resistors and capacitors in the filter. Thus, tunable or programmable filter circuits depend on the ability to adjust resistor and/or capacitor values.

When implementing integrated or monolithic programmable analog circuits, and particularly filters, processing and temperature variations can cause the values of various components in the circuit to vary by as much as 50%, which in turn can cause important circuit parameters, such as RC product, to vary by even greater amounts from their nominal design value. One conventional solution is to use integrated amplifiers in conjunction with high-precision, external resistors and capacitors. However, this approach is counterproductive to the goal of creating an integrated filter circuit, and increases both the size and the cost of the resulting filter.

Another solution is to provide for a fully integrated filter with an RC product that can be tuned to account for various process and temperature variations. One method for doing this, is to replace passive resistors with active resistors made from metal oxide field effect transistors (MOSFETs). For example, a feedback circuit can be implemented which continuously measures the RC product of the filter with reference to, for example, a clock or an external high-precision resistor. The outputs of the tuning circuit are then continuously applied to the MOSFET devices to set their resistances. A disadvantage to this technique is that the tuning circuits are very complex, sometimes more complex than the filter itself. Additionally, such tuning circuits usually require substantial amounts of power, and the variable range of the MOS resistors may not be sufficient to provide desired filter tunability. As an alternative to a tuning circuit and MOSFET resistors, arrays of passive resistors can be used with analog switches to afford programmability. However such an approach suffers from signal distortion due to the analog switches.

Still another alternative is to construct tunable filters by using tunable capacitor arrays and linear, passive resistors. Unfortunately, the value of capacitance per unit area in ordinary integrated circuit manufacturing processes is usually not well controlled. Therefore, if an accurate value of capacitance is needed for an integrated circuit capacitor, the manufacturer must "trim" the capacitor as needed to compensate for the large variations inherent in ordinary integrated circuit manufacturing processes. One well known way of trimming the value of an integrated circuit capacitor is to provide an array in which a main capacitor of somewhat smaller than nominal capacitance is initially in parallel with a number of smaller "trim" capacitors, which then can be removed from parallel connection with the main capacitor by trimming, for example by using a laser to cut electrical connections which directly or indirectly remove one or more of the trim capacitors from parallel connection to the main capacitor. This technique has the significant drawback that it requires that there be a capacitor trimming operation, which can add significantly to the cost of the product. Another problem with this technique is that it is not well suited to use in a user-programmable capacitor array because each user-programmable capacitance value has to be separately trimmed. Compounding this problem is the desire to have a wide range of programmable capacitances with high resolution (i.e., small steps between available capacitances).

Accordingly, it is desirable to have a user-programmable capacitor array that has high resolution and a wide range of available capacitances, while at the same time having an efficient and effective mechanism for a manufacturer to carry out trim operations. Additionally, it is desirable to have such a user-programmable capacitor array for use in programmable analog integrated circuits, particularly programmable filter circuits.

SUMMARY OF THE INVENTION

It has been discovered that a programmable capacitor array including a plurality of user-selectable, numerically weighted capacitors, each of which includes at least one fixed capacitor and one manufacturer-controlled trim capacitor, advantageously provides a variety of selectable capacitance values for a programmable analog integrated circuit. When coupled to a memory, for example a static memory, switches can be controlled that determine whether a particular fixed capacitor (user-selectable) or trim capacitor (manufacturer-selectable) is electrically coupled into the circuit. User access to those portions of memory controlling switches associated with the trim capacitors can be restricted via an I/O interface and security command. Such programmable capacitor arrays allow efficient implementation of user-programmable filter circuits where the user can conveniently program or reprogram a variety of filter parameters.

Accordingly, one aspect of the present invention provides a programmable capacitor array including a plurality of user-selectable capacitors. Each of the plurality of user-selectable capacitors is coupled in series with an associated user-controlled switch. Each of the plurality of user-selectable capacitors and associated user-controlled switches is coupled in parallel with each other of the plurality of user-selectable capacitors and associated user-controlled switches. At least one of the user-selectable capacitors includes at least one trim capacitor coupled in series with a manufacturer-controlled switch, and at least one fixed capacitor coupled in parallel with the at least one trim capacitor and the manufacturer-controlled switch.

In another aspect of the invention, a programmable analog circuit includes an amplifier having at least one input terminal and at least one output terminal, and a programmable capacitor array coupled between the at least one input terminal and the at least one output terminal. The programmable capacitor array includes a plurality of user-selectable capacitors. Each of the plurality of user-selectable capacitors is coupled in series with an associated user-controlled switch. Each of the plurality of user-selectable capacitors and associated user-controlled switches is coupled in parallel with each other of the plurality of user-selectable capacitors and associated user-controlled switches. At least one of the user-selectable capacitors includes at least one trim capacitor coupled in series with a manufacturer-controlled switch, and at least one fixed capacitor coupled in parallel with the at least one trim capacitor and the manufacturer-controlled switch.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
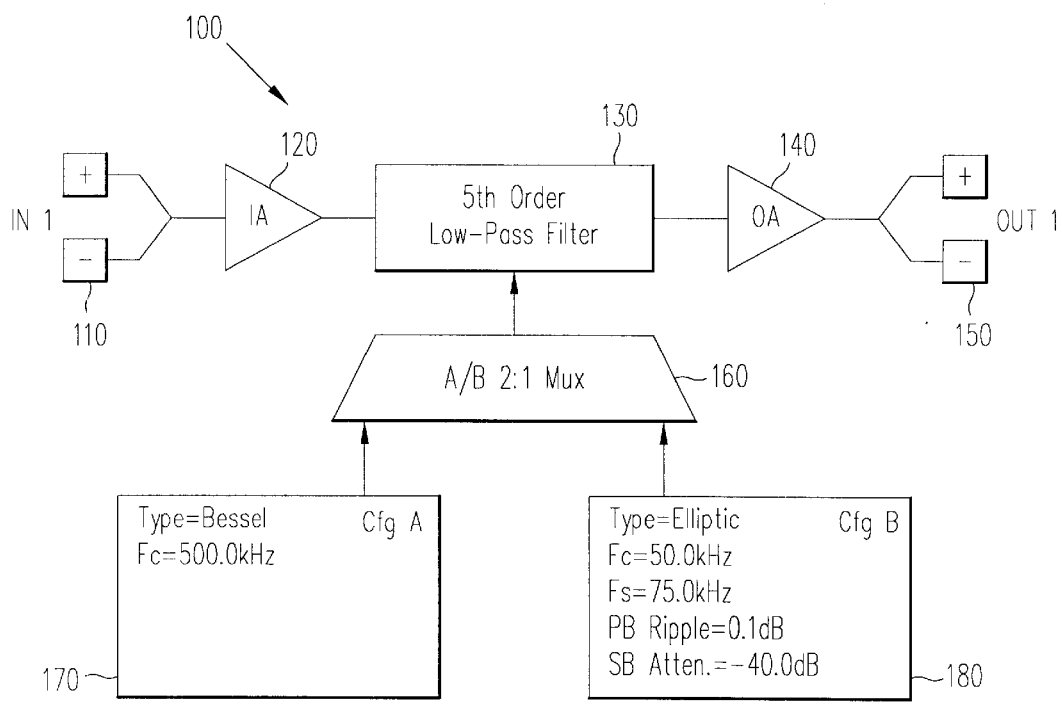
FIG. 1 is a block diagram of a programmable continuous time 5th order low-pass filter.

FIG. 1 is a block diagram of a programmable continuous time 5th order low-pass filter integrated circuit 100. Differential inputs 110 provide input signals to differential input instrumentation amplifier 120. Although only one instrumentation amplifier 120 is illustrated, an alternative implementation would have dual input instrumentation amplifiers and provide, for example, signal summation. Instrumentation amplifier 120 is implemented as a programmable gain amplifier with, for example, four gain values (1, 2, 5, and 10) that are user-programmable. Noise signals that are common to both inputs, i.e., common-mode signals, typically pass through amplifier 120 un-amplified. The effectiveness of amplifier 120 at rejecting common-mode signals is usually measured as a function of differential voltage gain to the common-mode voltage gain called the common-mode rejection ratio (CMRR). Consequently, a common-mode feedback topology (not shown) is usually implemented with or within instrumentation amplifier 120.

Output signals from instrumentation amplifier 120 are sent to 5th order low-pass pass filter 130. Filter 130 is just one example of a programmable analog block that can be selectively coupled into integrated circuit 100. For example, integrated circuit 100 can include additional programmable analog blocks, for example a high-pass filter that can be programmably selected by a user and thereby coupled into a signal path. For a more general description of programmable analog integrated circuit architecture, gee the aforementioned U.S. Pat. No. 5,574,678. Signals then pass from filter 130 to output amplifier 140, and to differential outputs 150.

Memory 170 and 180, which is preferably part of integrated circuit 100, store user-programmable values that specify particular filter parameters as illustrated, i.e., configuration A and configuration B. As indicated above, and further described below, the values stored typically represent settings for user selectable capacitor values, a particular combination of capacitor values yielding a corresponding set of filter parameters. Memory 170 and 180 can be implemented using static read only memory, dynamic random access memory, static random addressable memory, a serial string of shift registers, electronically erasable ($E^2$) memory, or any other memory. Multiplexer 160 allows one of the two stored configuration to be programmed into filter 130, depending on, for example, a user command selecting one of the configurations.

Figure 2A:
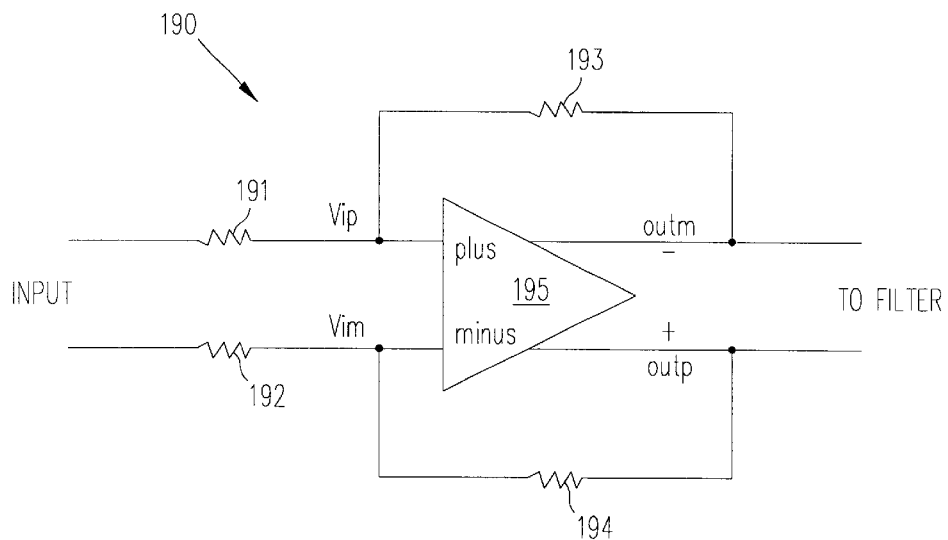
FIG. 2A illustrates a common mode feedback stage.
Figure 2:
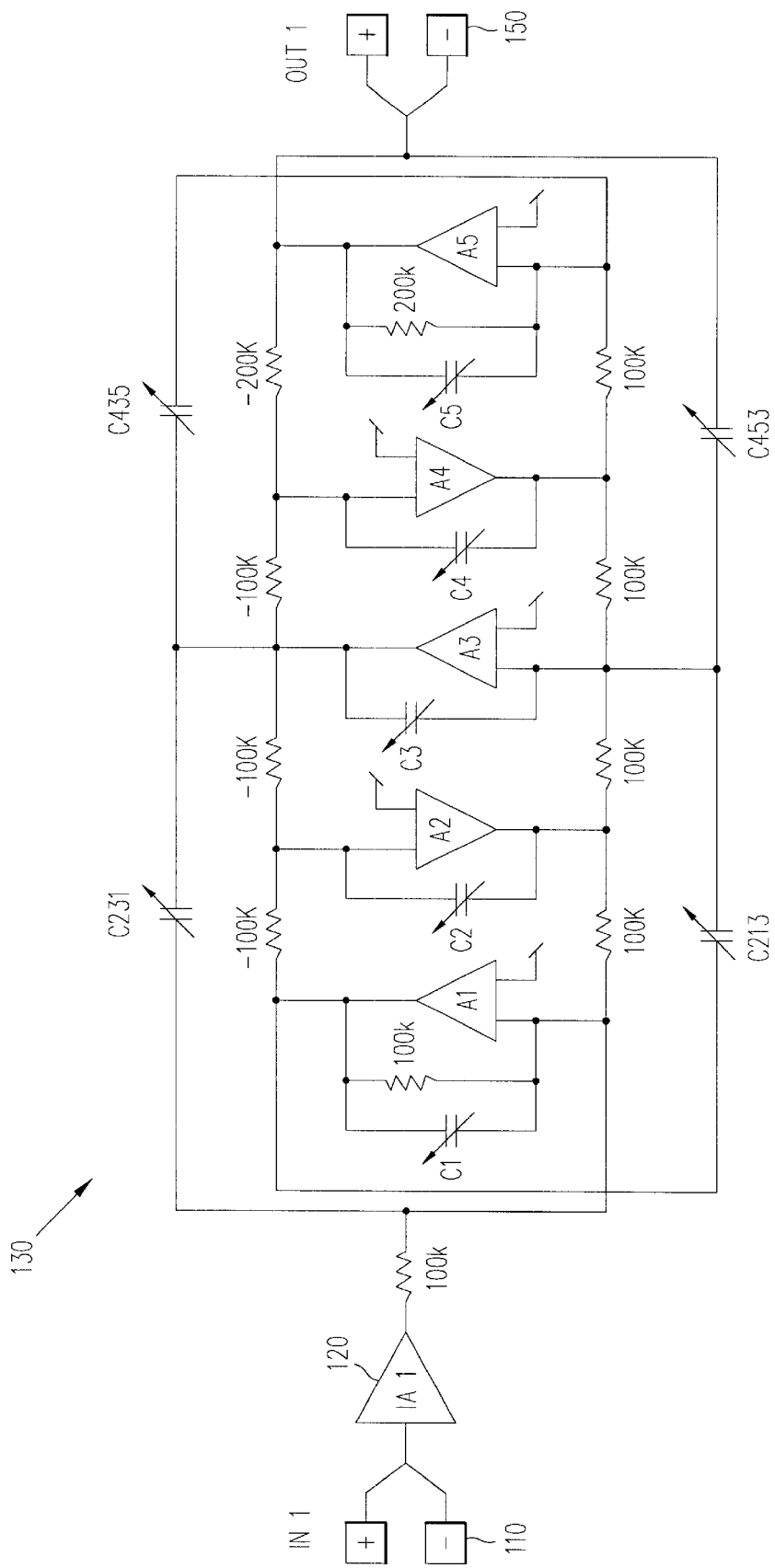
FIG. 2 shows circuit details of the 5th order low-pass filter of FIG. 1.

Note that throughout FIGS. 1 and 2, the circuit paths are represented as being single-ended for convenience. The circuits illustrated are implemented with fully differential circuit pathways in their preferred embodiments, although single-ended operation is possible by design, by programming, or via conversion circuits at the input and output nodes. Differential architecture substantially increases dynamic range as compared to single-ended I/O, while affording improved performance with regard to circuit specifications such as common mode rejection and total harmonic distortion. Moreover, differential operation affords added immunity to variations in the circuit's power supply.

FIG. 2 illustrates details of the 5th order low-pass filter circuit 130. Filter 130 is constructed using a ladder architecture, a filter architecture well known to those having ordinary skill in the art of filter design and use. The ladder architecture is based on passive LC components cascaded, much in the same way as a typical RC filter structures. Due to the lossless nature of their reactive LC components, doubly terminated passive ladder filters minimize sensitivity of the filter's transfer function to changes in element values due to temperature and manufacturing tolerances. This low sensitivity, particularly in the passband, to component tolerance makes the ladder architecture very advantageous. Active ladder filters such as filter 130 are based upon topologies that use RC equivalents to realize a passive LC ladder filter. Two common approaches to realizing and active inductor are component simulation using general immittance converters to model inductors, and operational simulation to simulate the branch currents of a network as voltages. In the latter approach, RC operational amplifier integrators are used with time constants proportional to the inductors and capacitors in the original, simulated filter.

Note that filter 130 is a low-pass filter, but other filter types (e.g., high-pass and band-pass) could similarly be implemented, as well as different filter topologies (e.g., cascaded active RC filters, bi-quadradic filters).

Amplifiers A1, A2, A3, A4, and A5 are important to the overall performance of filter 130. Although the ladder architecture tolerates finite bandwidth effects better than other filter topologies, amplifier unity-gain bandwidth should be approximately 10–20 MHz so that the ladder filter can achieve good performance across a wide range of corner frequencies up to 500 kHz. Amplifiers A1, A2, A3, and A4 drive internal nodes of the filter, while amplifier A5 must drive output loads as well. Note that in a typical implementation, amplifier A5 integrates the functions of the final amplifier stage of the ladder filter, and output amplifier 140, thereby eliminating the need for a separate output buffer. Also in a typical implementation, amplifiers A1 and A5 can include special trim features, For example, amplifier A1 can include an analog trim cell for residual differential offset of the entire filter. The differential offset correction is preferably made in the first amplifier of the ladder so that added stress, for example pushing the amplifier to a rail, is not placed on succeeding amplifiers in the filter. Additionally, amplifier A5 can include circuitry to implement automatic calibration of the filter, and to provide differential analog trim of the common mode output voltage.

As noted above, integrated circuit 100 can include a common-mode feedback circuit implemented in conjunction with instrumentation amplifier 120. FIG. 2A illustrates a common mode feedback (CMFB) stage 190 typically located after instrumentation amplifier 120 in order to determine the CMFB of the input front end. CMFB stage 190 is an inverting gain stage including an amplifier 195 having feedback resistors (193 and 194) and input resistors (191 and 192). Since the CMFB is only on the output of the amplifier, the input common mode voltage of amplifier 195 moves around. For example, if the gain of the CMFB stage 190 is −1, the input nodes of amplifier 195 will swing from 1.75 volts to 3.25 volts, half of the typical 1.0–4.0 volts swing on the input. This architecture improves the CMRR because the mismatch in the amplifier 195 output stage is divided by the differential loop gain. However, one source of error is resistor mismatch. The plus and minus channel in the differential paths each go through a resistor division path. If the gain of the two paths are slightly different, the CMRR will degrade since the circuit cannot distinguish the common mode and the differential mode signals. The common mode signal is subtracted after the two paths have gone through the resistor division. Since the resistor matching in many integrated circuit fabrication processes is poor, (e.g., the resistor matching is as bad as 2%, which corresponds to 46 dB CMRR even if only one pair of resistors has such mismatching) a resistor trim feature is typically included. An example of such a trim feature is shown in U.S. patent application Ser. No. 09/506,180, entitled "An Amplifier Having an Adjustable Resistor Network," by Hans W. Klein, Jian Li, and Yaohua Yang, filed on Feb. 17, 2000, which is incorporated herein by reference in its entirety.

One difficulty can arise due to the parasitic pole caused by the feedback resistors and the parasitic capacitance at the input of amplifier 195, which can include $C_{GS}$ of the amplifier 195 input devices and the capacitance associated with transistors in a CMRR trim feature. Since it is desirable for the bandwidth of the loop to be large (in order to get good closed loop AC response), the parasitic pole is preferably pushed far out by using small resistors (typically 3.5 k-ohms) in the feedback.

Filter parameters are determined by the various combinations of resistances and capacitances in filter 130. As discussed above, and illustrated in FIG. 2, the resistances of the filter remain at fixed values, and filter programmability is achieved through the use of variable capacitors, specifically programmable capacitor arrays C1, C2, C3, C4, C5, C213, C231, C435, and C453. By varying the values of these capacitors, different types of low-pass filters (e.g., Chebyshev, Bessel, Gaussian, Legendre, elliptic (Cauer), and linear phase equi-ripple) with different ranges of operating parameters can be implemented using filter 130. Table 1 shows an example of the types of filters that can be implemented using filter 130 and varying the values of programmable capacitor arrays C1, C2, C3, C4, C5, C213, C231, C435, and C453. Again, it should be noted that filter 130 is typically implemented differentially, and thus the actual circuit includes two instances of each of the programmable capacitor arrays C1, C2, C3, C4, C5, C213, C231, C435, and C453.

TABLE 1

| Filter Category | Filter Type | Corner Frequency | Pole Spacing |
|---|---|---|---|
| Elliptic CC0510 (0.10 dB ripple) | θ = 22°–55° | 50 kHz–500 kHz | ±3.7% |
| Elliptic CC0510 (0.15 dB ripple) | θ = 22°–55° | 50 kHz–500 kHz | ±3.7% |
| Elliptic CC0510 (0.20 dB ripple) | θ = 22°–55° | 50 kHz–500 kHz | ±3.7% |
| Bessel | | 50 kHz–500 kHz | ±3.7% |
| Linear Phase Equi-ripple Error | Phase error = 0.05°, 0.5° | 50 kHz–500 kHz | ±3.7% |
| Gaussian | Gaussian to 6 dB, 12 dB | 50 kHz–500 kHz | ±3.7% |
| Legendre | | 50 kHz–500 kHz | ±3.7% |

In order to implement these different types of filters in the parameter ranges specified, the capacitor sizes in filter 130 must be variable across wide ranges of values, and must vary in sufficiently small steps. Table 2 illustrates an example of the programmable capacitor array requirements to implement the various filters of Table 1. Note that Table 1 is merely an example of one possible implementation, and those having ordinary skill in the art will readily recognize possible variations to implement different types of filters, different parameter ranges, and different resolutions.

TABLE 2

| Capacitor Array | No. of Capacitors | Minimum Capacitor (pF) | Minimum Capacitor (pF) | Maximum Spacing |
|---|---|---|---|---|
| C1 | 12 | 42.732 | 0.417 | ±3.72% |
| C2 | 9 | 48.369 | 1.241 | ±3.27% |
| C3 | 9 | 83.090 | 2.066 | ±3.63% |
| C4 | 8 | 59.041 | 1.856 | ±3.47% |
| C5 | 9 | 39.607 | 0.984 | ±2.95% |
| C213 | 11 | 9.359 | 0.122 | ±3.34% |
| C231 | 11 | 9.359 | 0.122 | ±3.34% |
| C435 | 12 | 32.359 | 0.326 | ±3.47% |
| C453 | 12 | 16.180 | 0.163 | ±3.47% |

In the example of filter 130, it should be noted that programmable capacitor arrays C213 and C231 have a fixed relationship, namely that they must have the same value. Similarly programmable capacitor arrays C435 and C453 have a fixed relationship, namely that programmable capacitor array C453 is half the value of programmable capacitor array C435. Consequently, although a total of 93 capacitors are used in the programmable capacitor arrays, only 70 bits are needed to program these programmable capacitor arrays (11 bits for C213 and C231 combined, and 12 bits for C435 and C453 combined).

As illustrated by the examples in Table 2, each of the programmable capacitor arrays do not necessarily need to have he same number of capacitors, except where design restrictions require such similarity. This is due, in part, to the fact that higher resolution of individual programmable capacitor arrays is needed in some parts of the circuit, as compared to other parts of the circuit. Also, the values of each of the capacitors in any one programmable capacitor array are numerically weighted to provide the desired range and resolution of capacitance values. For example, a programmable capacitor array can be binarily weighted, wherein the values or each of the capacitors in the array are related as 1, 2, 4, 8, 16, etc. Other schemes for numerically weighting the capacitors in a programmable capacitor array, for example uneven weighting schemes (e.g., 1, 1.3, 1.6, 2.1, etc.), linear schemes, or other non-linear schemes, can be implemented as appropriate.

Figure 3:
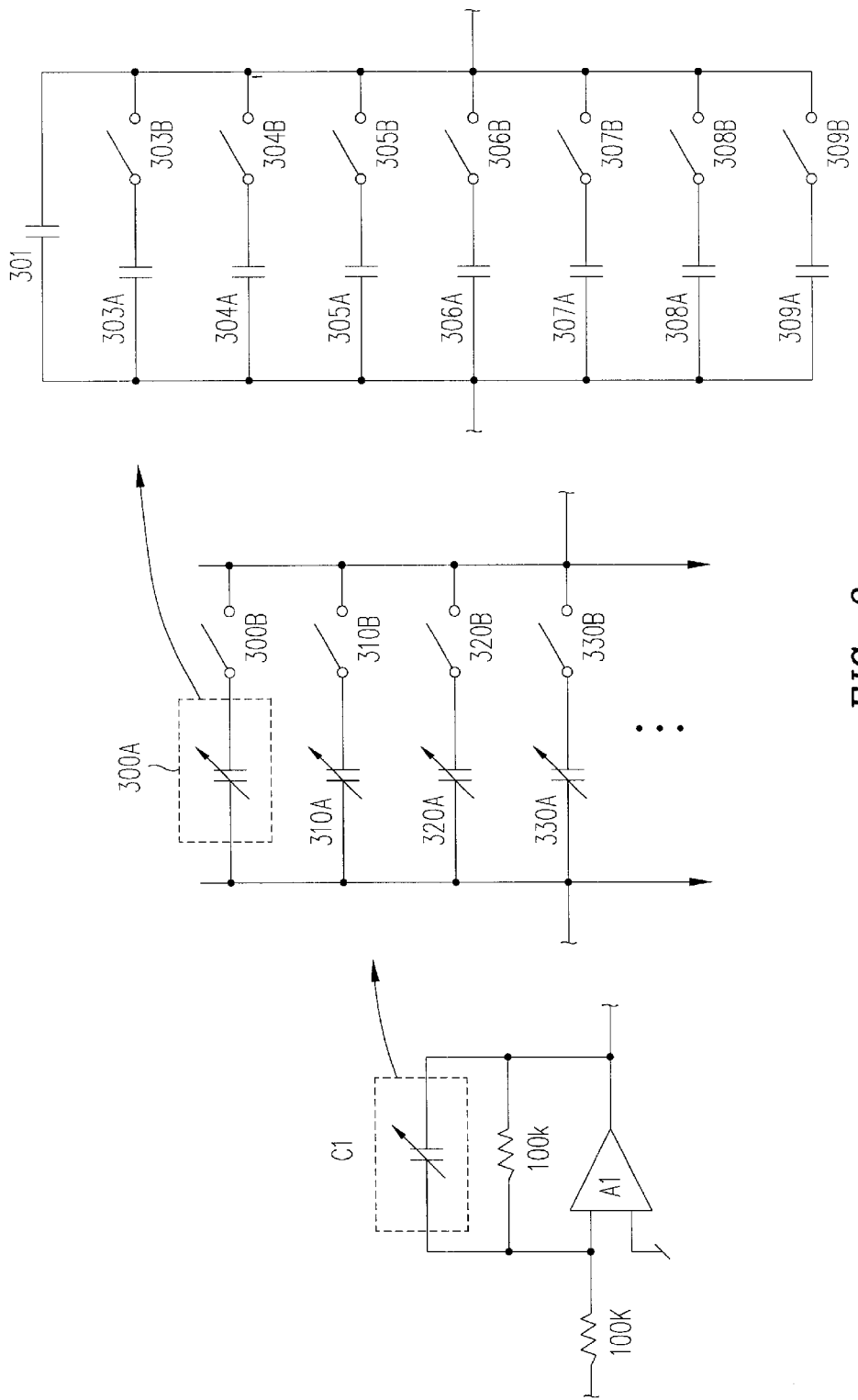
FIG. 3 illustrates portions of a programmable capacitor array.

FIG. 3 illustrates portions of one of the programmable capacitor arrays, C1. Programmable capacitor array C1 includes, for example, twelve user-selectable capacitors in parallel, four of which (300A, 310A, 320A, and 330A) are shown in FIG. 3. Each user-selectable capacitor is coupled in series with a user-controlled switch such as switches 300B, 310B, 326B, and 330B. The switches allow a user to set the capacitance of programmable capacitor array C1 by selecting which of the associated capacitors is electrically coupled into the circuit. User-selectable capacitors 300A, 310A, 320A, and 330A are shown as variable capacitors, because their respective values can be adjusted or trimmed by the manufacturer.

User-selectable capacitor 300A is shown in greater detail, and it includes fixed capacitor 301, and trim capacitors 303A, 304A, 305A, 306A, 307A, 308A, and 309A, all of which are coupled in parallel. Each of the trim capacitors is coupled in series with a manufacturer-controlled switch such as switches 303B, 304B, 305B, 306B, 307B, 308B, and 309B. The values of the trim capacitors are numerically weighted (e.g., binarily weighted), and typically scaled to each have a capacitance that is some set percentage of fixed capacitor 301. Since all of the capacitors of integrated circuit 100 are typically made using the same process, the process variations that cause the deviation of the actual capacitance of a capacitor from its nominal capacitance will effect all capacitors proportionally. Thus, trim capacitors designed to have capacitances that are set percentages of the fixed capacitor they are to trim, can all be set by the same programming bits. That is, every capacitor will deviate from its nominal value by the same percentage, so only one set of trim bits (defining one trim percentage) need be used for all user-selectable capacitors in each of the programmable capacitor arrays, so long as the values of individual trim capacitors are set as a percentage of their associated fixed capacitor. Although not shown, user-selectable capacitors can include "fixed" trim capacitors in addition to the trim capacitors coupled in series with manufacturer-controlled switches. Alternately, the trim capacitors can be designed to be automatically electronically coupled into the circuit so that the trimming process involves opening switches to remove associated trim capacitors from the circuit. Access to the manufacturer-controlled switches is usually limited by an integrated circuit programming or I/O interface command or secret key value.

Although the trimming process focuses on user-selectable capacitor values, one goal of the trimming process is to achieve desired RC products, particularly in the context of a filter circuit such as filter 130. To that end, a typical manufacturer's trim procedure can include programming filter 130 to behave (nominally) as a specific type of filter having specific parameters. Then, one can test the filter to determine just how close to the filter is to its nominal filtering characteristics, and adjust trim capacitors accordingly. Several of such tests can be performed, and the filter characteristics can be different for each test so that a range of filter behavior can be examined.

Figure 4:
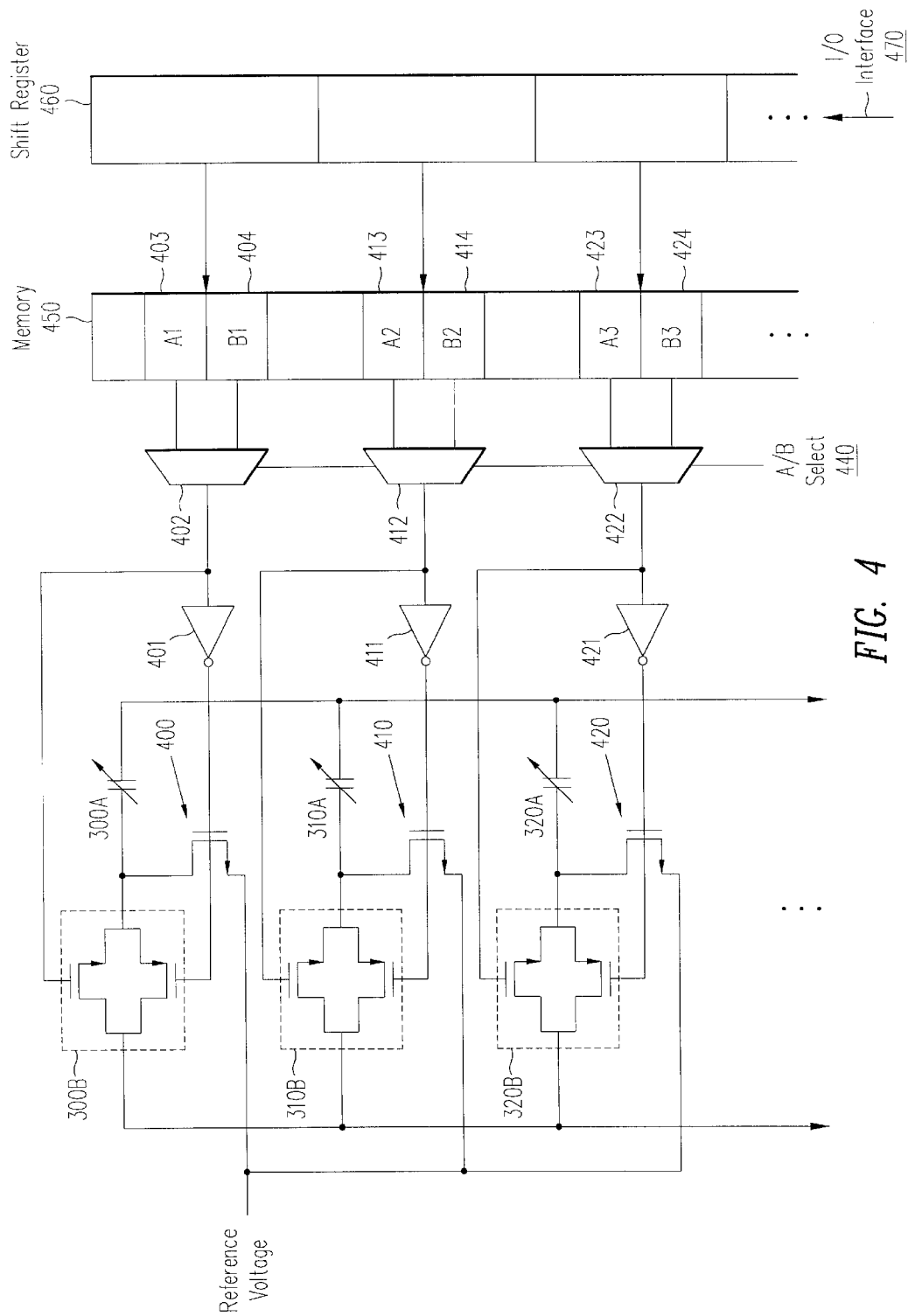
FIG. 4 illustrates a portion of programmable capacitor C1 including logic and memory to facilitate programmability.

In FIG. 4, part of programmable capacitor array C1 is illustrated, including user-selectable capacitors 300A, 310A, 320A, an example implementation of user-controlled switches 300B, 310B, and 320B (in this example, CMOS transmission gates) and corresponding signal inverters 401, 411, and 421. The input of programmable capacitor array C1 is coupled in parallel to all of the user-controlled switches 300B, 310B, and 320B. The other side of each user-selectable capacitor 300A, 310A, 320A is coupled to the output of programmable capacitor array C1. Accordingly, by turning on or off individual switches, the capacitance of programmable capacitor array C1 can be programmably controlled. The information which controls programmable capacitor array C1 is stored within a memory, such as memory 450. Capacitors that are not selected within the programmable capacitor array are, in one example, connected to a reference voltage via NMOS transistors 400, 410, and 420, thereby eliminating the capacitors that are not selected from any circuit interaction. A similar scheme can be used to implement the trim capacitors and their associated manufacturer-controlled switches. However, in a preferred embodiment, the manufacturer-controlled switches used for trim capacitors are chosen to be PMOS transistors because the "on" voltage for the switches is 0 V, instead of some non-zero value (e.g., 5 V), which eliminates one potential distortion source associated with the power supply rejection ratio (PSRR). Nevertheless, a variety of different switch implementations for both the user-controlled switches and the manufacturer-controlled switches (e.g., NMOS, PMOS, CMOS, or others) will be known to those having ordinary skill in the art.

Multiplexers 402, 412, and 422, along with memory 450 are used to implement the multiple filter configuration capability discussed above in conjunction with FIG. 1. Memory 450 stores pairs of configuration values A1 and B1, A2 and B2, etc., in associated memory storage elements 403 and 404, 413 and 414, etc. The configuration values represent bits used to program the various programmable capacitor arrays. The configuration of filter 130 can be quickly changed via A/B select line 440. Depending upon which configuration is selected, multiplexers 402, 412, and 422 provide values stored in memory 450 for one of the two configurations. The dual-configuration architecture need not be implemented, and thus, a single memory storage element can be associated with each user-selectable capacitor. Alternately, more than two configurations can be stored using additional memory storage elements and appropriate multiplexers. Additionally, the trim capacitors and manufacturer-controlled switches can be programmed in a manner similar to that illustrated with respect to the user-selectable capacitors. Memory 450 is preferably a static memory, such as a electronically erasable ($E^2$) memory.

Switch control values are typically loaded into memory 450 via a shift register 460, which in turn receives input values through an 110 interface 470. Examples of suitable I/O interfaces include the serial peripheral interface (SPI) from Motorola, Inc., and the Joint Test Access Group (JTAG) interface associated with the IEEE Standard Test Access Port and Boundary Scan Architecture (IEEE 1149.1). Use of these, and other, interfaces for programming integrated circuits is well known to those having ordinary skill in the art. However, implementing the above described manufacturer-controlled switches requires some additional mechanism, such as a secret command or key to limit or prevent user access to the trim capacitors. Additionally, the memory for storing bit values for the manufacturer-controlled switches can be a memory separate from the memory storing values for the user-selectable capacitors.

The multiple feedback paths of filter 130 and the complexity of the programmable capacitor arrays presents difficulties in testing and debugging such an integrated circuit. It is very difficult to locate a problem in the filter without breaking the feedback network. Additionally, even if the circuit performs perfectly, verifying that the programmable capacitor arrays function properly can be extremely difficult. Consequently, it is advantageous to implement a special capacitor array test mode in the circuit for filter 130. There are two basic elements to implementing the capacitor array test mode: (1) the ability to disable one or more of the ladder filter amplifiers A1, A2, A3, A4 and A5 (i.e., to "tristate" the amplifiers) thereby deactivating certain portions of the circuit; (2) an analog interconnect array (AIC) built around the filter to reconfigure the filter into an integrator to carry-out capacitor array tests. For example, one can configure an integrator with amplifier A5 as the operational amplifier, the capacitor array under test as the feedback capacitor, and the resistors in the filter and the AIC serving as feedback and feed forward resistors. The remaining amplifiers are tristated during the test. A test signal, for example a step stimulus, is brought to the input of amplifier A5 from an input pin. By measuring the step response of the integrator (e.g., the rise time) associated with each of the capacitors in a capacitor array, one can determine if the capacitor array is behaving as designed.

Figure 5:
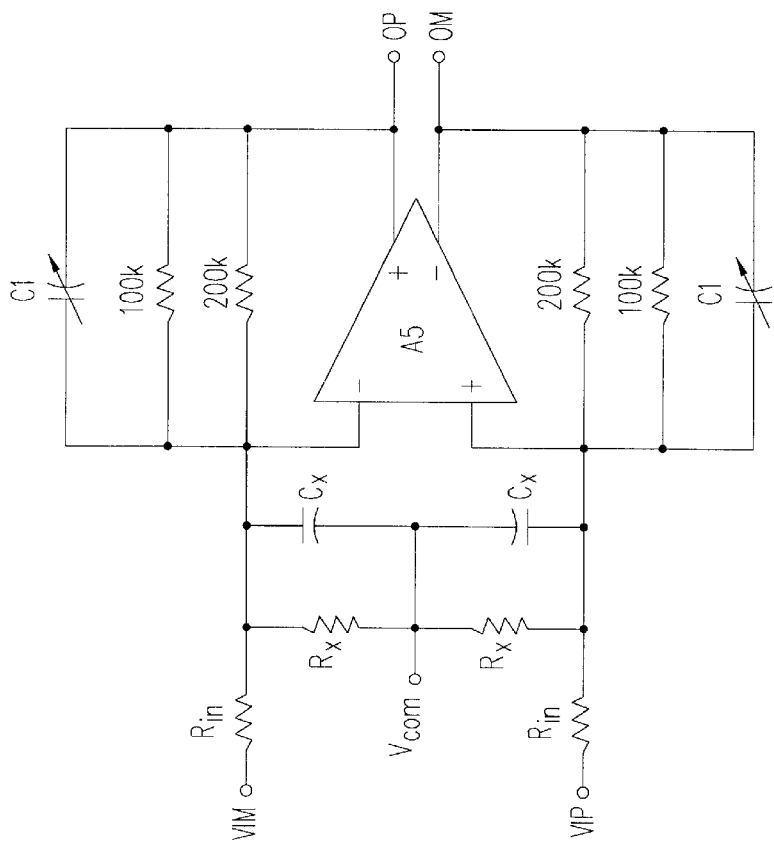
FIG. 5 illustrates a simplified circuit topology used for testing programmable capacitor C1.

FIG. 5 illustrates a simplified circuit topology (based on filter 130) used for testing programmable capacitor array C1. Note that in this circuit, the differential nature of filter 130 is illustrated. Programmable capacitor array C1 is the feedback capacitor for the integrator of FIG. 5. Feedback resistance $R_x$ and capacitance $C_x$ represent the cumulative effect of portions of the filter circuit, and are therefore fixed. Turning on and off each of the capacitors in programmable capacitor array C1, one after another (starting from smallest to largest) and measuring the step response, one can determine if the capacitors are functioning, and if their values are in the expected range. Another method, particularly useful for very small capacitors, is to measure the total capacitance of programmable capacitor array C1 by turning off all of the capacitors in the array, and adding them into the circuit one at a time. Input resistors $R_{in}$ can be selected, for example switched in as part of the AIC, to insure stability of the circuit and proper signal response. Other topologies, similar to that illustrated in FIG. 5, for testing other programmable capacitor arrays in filter circuit 130 are readily apparent to those having ordinary skill in the art.

Figure 6:
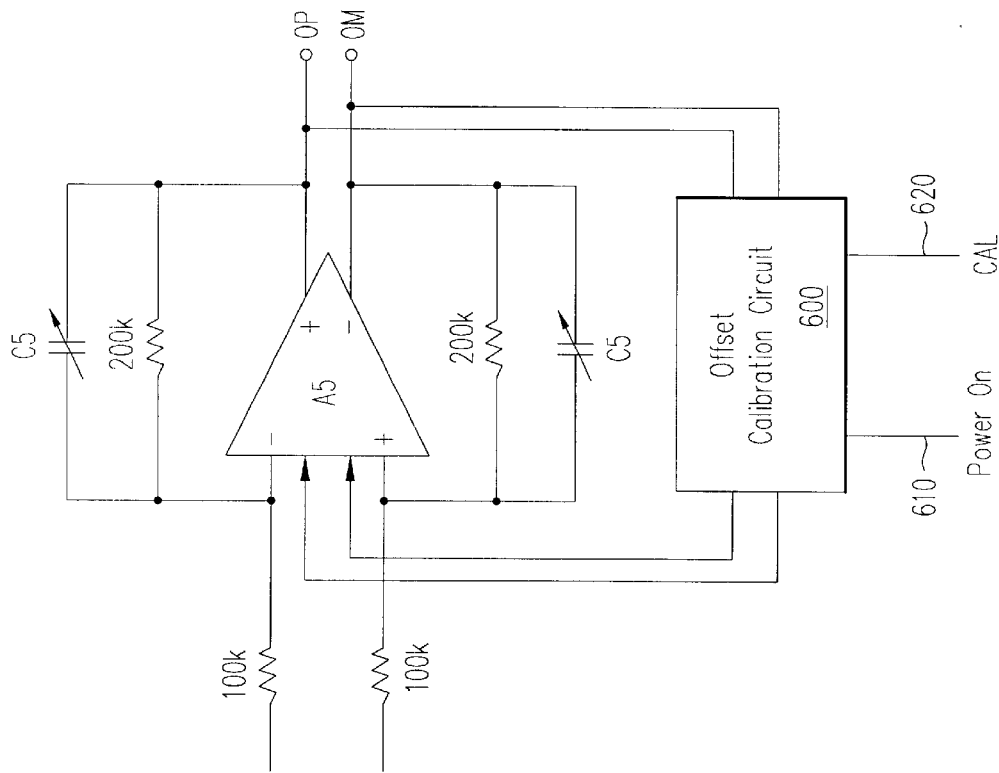
FIG. 6 illustrates a calibration circuit used in conjunction a portion the filter shown in FIG. 2.

Like many other analog circuits, filter 130 is susceptible to output offset voltages due to, for example, component mismatch or component variations associated with integrated circuit fabrication processes. To overcome such offset volcages, an offset calibration feature can be included in the circuit. FIG. 6 illustrates an example of such a calibration feature associated with amplifier A5 of filter 130, that is the last amplifier of the filter. Calibration circuit 600 senses the output offset voltage when the entire circuit is placed in a calibration mode, develops a current to correct for the offset voltage, and injects the correction current into amplifier A5. One example of a calibration circuit 600 is described in U.S. patent application Ser. No. 09/053,251, entitled "Offset Voltage Calibration DAC with Reduced Sensitivity to Mismatch Errors," by James L. Gorecki and Yaohua Yank, which is incorporated herein by reference in its entirety. Calibration mode can be initiated by, for example, a circuit power on signal asserted on input line 610, or a calibrate signal asserted on input line 620.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A programmable capacitor array comprising:
    a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
        at least one trim capacitor coupled in series with a manufacturer-controlled switch; and
        at least one fixed capacitor coupled in parallel with the at least one trim capacitor and the manufacturer-controlled switch;
    wherein the at least one associated user-controlled switch is coupled to a memory, and
    wherein the memory is operable to contain two switch control values programmable by the user, the memory coupled to the at least one associated user-controlled switch through a multiplexer for selectively coupling one of the two switch control values to the at least one associated user-controlled switch.

2. The programmable capacitor array of claim 1 wherein the memory is a static memory.

3. The programmable capacitor array of claim 1 wherein the plurality of user-selectable capacitors are numerically weighted.

4. The programmable capacitor array of claim 3 wherein the plurality of user-selectable capacitor are binarily weighted.

5. The programmable capacitor array of claim 1 wherein the at least one manufacturer-controlled switch is closed such that a capacitance of the at least one of the user-selectable capacitors includes the sum of a capacitance of the at least one trim capacitor and a capacitance of the at least one fixed capacitor.

6. The programmable capacitor array of claim 1 wherein the at least one trim capacitor includes a plurality of trim capacitors, each of the plurality of trim capacitors coupled in series with an associated manufacturer-controlled switch, and each of the plurality of trim capacitors and associated manufacturer-controlled switches being coupled in parallel with each other of the plurality of trim capacitors coupled in series with an associated manufacturer-controlled switch.

7. The programmable capacitor array of claim 6 wherein each of the plurality of trim capacitors has a capacitance, each of the plurality of trim capacitor capacitances being a predetermined percentage of a capacitance of the at least one fixed capacitor.

8. The programmable capacitor array of claim 1 wherein the associated user-controlled switches are transistors and the manufacturer-controlled switch is a transistor.

9. The programmable capacitor array of claim 1 wherein the associated user-controlled switches are one of p-channel MOSFETS, n-channel MOSFETS, and CMOS transmission gates, and wherein the manufacturer-controlled switch is one of a p-channel MOSFET, an n-channel MOSFET, and a CMOS transmission gate.

10. A programmable capacitor array comprising:
a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
  at least one trim capacitor coupled in series with a manufacturer-controlled switch; and
  at least one fixed capacitor coupled in parallel with the at least one trim capacitor and the manufacturer-controlled switch;
wherein the at least one associated user-controlled switch is coupled to a memory, the memory operable to contain at least one switch control value programmable by a user, the at least one switch control value selectively causing the at least one associated user-controlled switch to be turned on and off;
the array further comprising at least one of a serial peripheral interface (SPI) and a Joint Test Access Group (JTAG) interface for programming the memory operable to contain at least one switch control value programmable by the user.

11. A programmable capacitor array comprising:
a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
  at least one trim capacitor coupled in series with a manufacturer-controlled switch; and
  at least one fixed capacitor coupled in parallel with the at least one trim capacitor and the manufacturer-controlled switch;
wherein the manufacturer-controlled switch is coupled to a memory, the memory operable to contain at least one switch control value programmable by a manufacturer, the at least one switch control value selectively causing the manufacturer-controlled switch to be turned on and off;
the array further comprising:
  a Joint Test Access Group (JTAG) interface for programming the memory; and
  control logic implementing a secret key command, wherein the JTAG interface operates to program the memory operable to contain the at least one switch control value programmable by a manufacturer when presented with a secret key command.

12. A programmable analog circuit comprising:
an amplifier having at least one input terminal and at least one output terminal; and
a programmable capacitor array coupled between the at least one input terminal and the at least one output terminal, the programmable capacitor array including:
a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
  at least one trim capacitor coupled in series with a manufacturer-controlled switch; and
  at least one fixed capacitor coupled in parallel with the at least one trim capacitor and the manufacturer-controlled switch; and
wherein the at least one associated user-controlled switch is coupled to a memory,
wherein the memory is operable to contain two switch control values programmable by the user, the memory coupled to the at least one associated user-controlled switch through a multiplexer for selectively coupling one of the two switch control values to the at least one associated user-controlled switch.

13. A programmable analog circuit comprising:
an amplifier having at least one input terminal and at least one output terminal;
a programmable capacitor array coupled between the at least one input terminal and the at least one output terminal, the programmable capacitor array including:
a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
  at least one trim capacitor coupled in series with a manufacturer-controlled switch; and
  at least one fixed capacitor coupled in parallel with the at least one trim capacitor and the manufacturer-controlled switch; and
wherein the at least one associated user-controlled switch is coupled to a memory, the memory operable to contain at least one switch control value programmable by a user, the at least one switch control value selectively causing the at least one associated user-controlled switch to be turned on and off;
the programmable analog circuit further comprising at least one of a serial peripheral interface (SPI) and a Joint Test Access Group (JTAG) interface for programming the memory operable to contain at least one switch control value programmable by the user.

14. The programmable analog circuit of claim 13 wherein the plurality of user-selectable capacitors are numerically weight.

15. The programmable analog circuit of claim 14 wherein the plurality user-selectable capacitor are binarily weighted.

16. The programmable analog circuit of claim 13 wherein the at least one manufacturer-controlled switch is closed such that a capacitance of the at least one of the user-selectable capacitors includes the sum of a capacitance of the at least one trim capacitor and a capacitance of the at least one fixed capacitor.

17. The programmable analog circuit of claim 13 wherein the at least one trim capacitor includes a plurality of trim capacitors, each of the plurality of trim capacitors coupled in series with an associated manufacturer-controlled switch, and each of the plurality of trim capacitors and associated manufacturer-controlled switches being coupled in parallel with each other of the plurality of trim capacitors coupled in series with an associated manufacturer-controlled switch.

18. The programmable analog circuit of claim 17 wherein each of the plurality of trim capacitors has a capacitance, each of the plurality of trim capacitor capacitances being a predetermined percentage of a capacitance of the at least one fixed capacitor.

19. A programmable analog circuit comprising:
   an amplifier having at least one input terminal and at least one output terminal;
   a programmable capacitor array coupled between the at least one input terminal and the at least one output terminal, the programmable capacitor array including:
      a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
         at least one trim capacitor coupled in series with a manufacturer-controlled switch; and
         at least one fixed capacitor couple in parallel with the at least one trim capacitor and the manufacturer-controlled switch;
   wherein the manufacturer-controlled switch is coupled to a memory, the memory operable to contain at least one switch control value programmable by a manufacturer, the at least one switch control value selectively causing the manufacturer-controlled switch to be turned on and off;
   the programmable analog circuit further comprising:
      a Joint Test Access Group (JTAG) interface for programming the memory; and
      control logic implementing a secret key command, wherein the JTAG interface operates to program the memory operable to contain the at least one switch control value programmable by a manufacturer when presented with a secret key command.

20. A programmable analog circuit comprising:
   an amplifier having at least one input terminal and at least one output terminal;
   a programmable capacitor array coupled between the at least one input terminal and the at least one output terminal, the programmable capacitor array including:
      a plurality of user-selectable capacitors, each of the plurality of user-selectable capacitors being coupled in series with an associated user-controlled switch, and each of the plurality of user-selectable capacitors and associated user-controlled switches being coupled in parallel with each other of the plurality of user-selectable capacitors and associated user-controlled switches, wherein at least one of the user-selectable capacitors includes:
         at least one trim capacitor coupled in series with a manufacturer-controlled switch; and
         at least one fixed capacitor coupled in parallel with the at least one trim capacitor and the manufacturer-controlled switch; and
   a calibration circuit coupled a calibration input of the amplifier and the at least one output terminal of the amplifier, the calibration circuit providing a correction current to amplifier to correct for an offset voltage.

* * * * *

UNITED STATES PATENT AND TRADEMARK OFFICE
CERTIFICATE OF CORRECTION

PATENT NO.    : 6,424,209 B1
DATED         : July 23, 2002
INVENTOR(S)   : Gorecki et al.

It is certified that error appears in the above-identified patent and that said Letters Patent is hereby corrected as shown below:

Column 12,
Line 54, "weight." should be -- weighted. --.
Line 56, "plurality user-selectable capacitor" should be -- plurality of user-selectable capacitors --.

Column 13,
Line 27, "couple" should be -- coupled --.

Column 14,
Line 32, "to amplifier" should be -- to the amplifier --.

Signed and Sealed this

Twenty-eighth Day of January, 2003

JAMES E. ROGAN
*Director of the United States Patent and Trademark Office*